United States Patent [19]
Saville et al.

[11] 3,918,756
[45] Nov. 11, 1975

[54] WAFER HOLDER

[75] Inventors: Russell H. Saville, Minnetonka; Douglas M. Johnson, Carver, both of Minn.

[73] Assignee: Fluoroware, Inc., Chaska, Minn.

[22] Filed: Dec. 26, 1973

[21] Appl. No.: 427,454

[52] U.S. Cl. ................. 294/31.2; 118/500; 224/49; 294/33
[51] Int. Cl.$^2$ .......................................... B05C 13/02
[58] Field of Search ........... 294/1 R, 16, 27 R, 31.2, 294/31 R, 33, 74; 40/152, 156; 118/500–503; 211/41; 224/45 R, 45 K, 49, 58; 269/268–270, 254 R, 321 W, 321 WE

[56] References Cited

UNITED STATES PATENTS

| | | | |
|---|---|---|---|
| 71,336 | 11/1867 | Smith | 294/33 |
| 2,165,417 | 7/1939 | Schneider | 294/33 |
| 3,219,375 | 11/1965 | VanPelt | 294/16 |
| 3,486,631 | 12/1969 | Rodman | 118/500 X |
| 3,610,613 | 10/1971 | Worden | 269/254 |
| 3,804,311 | 4/1974 | Oglesbee | 224/49 |
| 3,834,349 | 9/1974 | Dietze et al. | 211/41 X |

*Primary Examiner*—Evon C. Blunk
*Assistant Examiner*—Johnny D. Cherry
*Attorney, Agent, or Firm*—H. Dale Palmatier; James R. Haller

[57] ABSTRACT

A silicon wafer holder of molded plastic in a unitary one piece integral construction having a suspending portion at the top of a deformable frame with an open interior in which the silicon wafer is received and held, the frame having side portions cradling the sides of the wafer at its edges, and inwardly projecting lugs at the side portions of the frame to retain the cradled wafer in stationary position, there being no inwardly projecting lugs or nibs at the bottom of the holder to avoid any obstructions which would tend to trap liquid and prevent free drainage of liquid from the wafer.

15 Claims, 11 Drawing Figures

FIG. 1

WAFER HOLDER

BACKGROUND OF THE INVENTION

Silicon wafers used in the semiconductor industry are only a few thousandths of an inch thick, and may be 3 inches or more in diameter. These silicon wafers are very fragile to handle and therefore must be very delicately handled. Such silicon wafers are processed through various steps, to bathe the wafers in certain liquid based materials which may be under substantial temperatures, in a range of 400°F. or more. It is necessary to keep such wafers scrupulously clean during the handling and processing. Touching of the wafers with a person's hand should be absolutely minimized, or eliminated altogether if possible.

In the past, during the processing of such wafers, the wafers have been carried in baskets so as to process a batch of these wafers through the various steps. The use of such baskets inherently produces a batch-type process which has certain limitations when high volume production and processing of such wafers is desirable.

BRIEF SUMMARY OF THE INVENTION

The present invention relates to silicon wafer-holding apparatus and more specifically to holders whereby each wafer is individually held and carried by a holder through a series of processing steps to the end that the processing can be automated and carried out with a minimum of handling of the wafers. The wafers are held at their edges by the holder which encompasses at least opposite portions of the wafer periphery so that the wafer will be adequately supported for processing purposes. The holders are formed of molded plastic, and in a one piece integral construction. Although the holders could be made of any of a number of temperature and chemical resistant plastics, it is desirable that fluorinated polyolefins, sold under the trademark "Teflon" by E. I. duPont DeNemours & Company, Inc. (e.g., Teflon PFA), have been found to be satisfactory. Such wafers are retained in the holders by small lugs or nibs to confront the opposite faces of the wafers. Such nibs or lugs may be disposed opposite each other to receive the identical portions of the wafer periphery therebetween, or the nibs or lugs facing opposite surfaces of the wafer may be spaced from each other along the wafer periphery.

The holders, in their natural shape, support the wafers without regard to the position the wafers are necessarily oriented in for a particular processing step which may be carried out. Further, as the wafers and holders progress through various baths or stages of processing, the various liquid materials are permitted to quickly drain off the wafers and will be drained from the holders so that there is no residual quantity of processing materials trapped or otherwise confined on any portion of the wafers or holders.

Because of the shape of the holders, there will be no tendency to loosen or release the wafers even though under extreme temperature conditions, the holder may be somewhat softened and may start to sag or deform under extreme temperature conditions.

The holders may be readily molded in injection molding machines to provide for a large volume of production.

DETAILED SPECIFICATION

Figures 1, 1A, 1B, 2, 3, 4, 5, 6, 7, 8, 9:
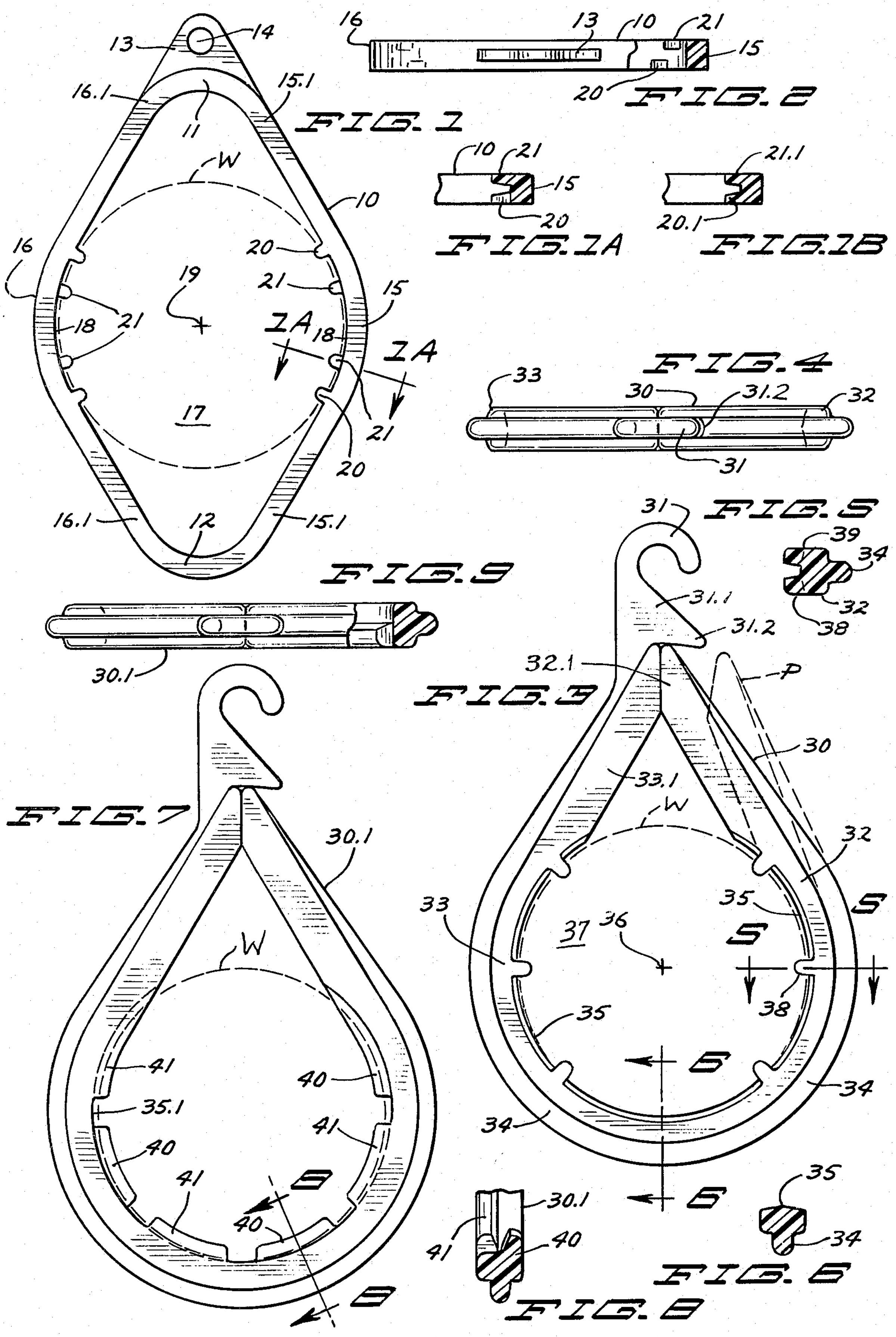
FIG. 1 is a front elevation view of one form of holder, and illustrating a silicon wafer in dotted lines, being held in the holder.
FIG. 2 is a top plan view of the holder of FIG. 1, and being partly broken away for clarity of detail.
FIG. 3 is a front elevation view of a modified form of holder.
FIG. 4 is a top plan view of the holder illustrated in FIG. 3.
FIG. 5 is a detail section view taken approximately at 5—5 in FIG. 3.
FIG. 6 is a detail section view taken approximately at 6—6 in FIG. 3.
FIG. 7 is a front elevation view of another modified form of holder.
FIG. 8 is a detail section view taken approximately at 8—8 in FIG. 7.
FIG. 1A is a detail section view taken at **1*a*—1*a* in FIG. 1.**
FIG. 1B is a detail section view similar to FIG. 1A, but illustrating a modified form of the invention.
FIG. 9 is a top plan view of the holder illustrated in FIG. 7.

The form of the invention illustrated in FIGS. 1, 1A and 2 includes an oblong endless enclosure frame 10 of a molded plastic material in a unitary and integral one piece construction. The frame 10 may be molded of any of a number of temperature and chemical-resistant plastics, and a Teflon PFA has been found to be satisfactory. The frame 10, of oblong shape, is stiff so that it will maintain its shape under normal operating conditions, but is sufficiently flexibly yieldable so that a person can deform the frame 10 by exerting inward manual pressure at the upper and lower ends 11 and 12.

The enclosure frame 10 has a web 13 formed at the upper end and provided with an aperture 14 for the purpose of suspending the frame 10 in upright position and thereby maintain the frame in its normal upright orientation. The frame 10 has a pair of opposite side portions 15 and 16 on opposite sides of the open interior 17 wherein the silicon wafer W is to be received. The side portions 15 and 16 of the same define wafer-cradling faces 18 which are generally circular, or partially circular in shape and are concavely formed about a horizontal axis 19 extending through the open interior 17.

The frame 10 has a plurality of inwardly projecting nibs or lugs 20 and 21 projecting inwardly from the side portions 15 and 16 of the frame adjacent the wafer-cradling faces 18. It will be noted that these lugs 20 and 21 are disposed at opposite sides of the faces 18 so as to confront and engage the opposite flat surfaces of the wafers W. It will be noted that the lugs 20 and 21 are tapered in order to easily guide the edges of the wafer into the correct position adjacent the faces 18.

Because of the oblong or diamond-like shape of the enclosure frame 10, the upper and lower ends 15.1, 16.1 of the side portions 15, 16 are disposed well away from the lugs 20, 21 and well away from the portion of the open interior 17 wherein the wafer W is received. Accordingly, the upper and lower ends 11 and 12 of the oblong enclosure frame which interconnect the side portions 15 and 16 together, are positioned so as to facilitate the outward displacement of lugs 20 and 21 along with the side portions 15 and 16 so as to release the wafer from its confined position. Of course, this same displacement is utilized in initially loading a wafer W into the holder.

Mere manual pressure by a person's hand on the upper and lower ends 11 and 12 of the enclosure frame produces sufficient inward displacement of the ends as to cause the necessary outward displacement of side portions 15 and 16 for loading and unloading the wafers.

It is important to note that the lowermost of the lugs 20 are disposed at the extreme sides of the open interior 17 wherein the wafer W is confined. There are no lugs on the frame immediately below the open interior for the wafer W and the space immediately below the wafer, and at the lower edge portion of the wafer is completely open and unobstructed by either frame 10 or by any of the lugs 20 or 21 so that the liquid in which the wafer W is processed may drain and drip free and clear without being captured or confined in any way.

It will be noted that each of the lugs 20 and 21 is spaced, in a direction along the periphery of the open interior 17, and along the curved periphery of faces 18 from adjacent lugs; and that adjacent lugs 20 and 21 are disposed at opposite sides of the face 18 to confront and confine the opposite surfaces of the wafer W. As a result of this arrangement, the enclosure frame 10 with lugs 20 and 21 may be very easily molded in a simple injection molding die. It may be desirable, in order to adequately hold the wafer W under certain circumstances, to arrange the lugs 20.1, 21.1 in pairs and opposite each other as illustrated in FIG. 1B. In FIG. 1B it is contemplated that at each location along the periphery of the interior opening 17 wherein there is to be a lug, there will be a pair of lugs opposite each other so as to both engage the same peripheral location of the wafer.

In the event that the holder 10 is exposed to some extremely high temperatures during the processing of the wafer W, and to the extent wherein the plastic material from which the frame 10 is made becomes somewhat softened and less stiff, the oblong shape of the frame 10, together with the suspension of the frame from the top web 13 will cause the enclosure frame 10 to maintain its grip and to continue to hold the wafer W in its proper position, simply by virtue of the weight of the oblong enclosure frame 10 together with the suspension of it from the top end. The weight of the lower portion 12 will tend to urge the side portions 15 and 16 inwardly, and the weight of the side portions 15 and 16 of the frame will contribute to this tendency in the event that the frame should become somewhat softened due to temperature. Because of this safety feature of the holder frame 10 there is no likelihood of inadvertently damaging the silicon wafer which is a relatively expensive article.

In the form of the invention shown in FIGS. 3–6, an enclosure frame 30, constructed of the same material as frame 10, is formed in a unitary one piece integral construction. In this form of construction, the frame is also generally oblong in shape, and an integral suspending hook 31 is provided for maintaining the frame in its normal upright position. The frame 30 and the wafer W contained therein will be suspended by hook 31 from any suitable support rack or moving conveyor. In this form of the enclosure frame, the opposite side portions 32 and 33 are provided with a stiffening web 34 to minimize the undesired flexing of the frame under high temperature conditions. As seen in FIG. 6, the inwardly facing, wafer-cradling face 35 on each of the side portions is somewhat rounded or conically shaped so as to present a minimum of area of the face 35 adjacent the edge of the wafer W being carried. The face 35 is concavely and generally circularly formed about a horizontal axis 36 located at the center of the open interior 37 wherein the wafer W is confined. The wafer-cradling face, in this form of FIG. 3, extends around the bottom edge of the wafer W and around the bottom periphery of the open interior space 37 so as to interconnect the two side portions 32 and 33.

In this form, the frame is provided with inwardly protruding lugs 38, 39 which are respectively disposed adjacent opposite sides of the face 35 and which are arranged in pairs so that at each peripheral location, the edge of the wafer W is confined by a pair of lugs.

The upper end 33.1 of the side portion 33 of the frame is formed integrally with the head 31.1 of which the hook 31 is formed. The upper end portion 32.1 of side portion 32 is separate and divergently movable relative to the upper end 33.1 of the opposite side. This upper end 32.1 of the side 32 is movable outwardly to and beyond the dotted line position P illustrated in FIG. 3 in order to produce the outward movement of the lugs 38, 39 away from the open interior space 37 as is necessary to facilitate loading and unloading the wafer W. Normally the upper end portion 32.1 will bear tightly against the corresponding portion of upper end 33.1 as illustrated, by virtue of the natural shape of the frame 30 and also by virtue of the latching projection 31.2 which bears downwardly on the tip of the upper end 32.1 ]nd retains the two side portions in the position shown in full line. The latching projection 31.2 interferes with the normal outward swinging of the upper end 32.1 of the side 32 so that under normal circumstances, without unusual forces, the frame 30 will be retained in its closed position as illustrated in full lines. The flexing of the head 31.1 of the frame or the downward camming of the side portion 32 of the frame is required in order to separate the two side portions of the frame for loading and unloading wafers.

It will be noted in this form of the frame that the lowermost lugs at each of the side portions of the frame are widely spaced from the lowermost portion of the open interior 37 so as to avoid any interference with the free drainage of liquid from the wafer W. The free drainage of liquid from the wafer is also aided by the somewhat curved or double conical shape of the face 35 at the lowest portion of the frame.

In the form of the invention illustrated in FIGS. 7, 8 and 9, the construction of the frame 30.1 is very nearly the same as that illustrated in FIGS. 3–6, excepting as to the shape of the lugs which are different in frame 30.1. In this form of the invention, the opposite sides of the frame are separable to be flexed away from each other for loading and unloading wafers. The lugs in this form of the invention are in the form of webs or ribs 40, 41 which are respectively disposed at opposite sides of the wafer-cradling face 35.1, which in this form of frame is very nearly cylindrical in shape with rounded edges and with the lugs 40, 41 protruding therefrom. The lugs or webs 40, 41 are arranged singularly at each peripheral location, and adjacent lugs are disposed at opposite sides of the wafer-cradling face 35.1 for confronting and engaging the opposite surfaces of the wafer W. In this form of the invention, it will be noted also that the lowermost lugs are spaced from the lowermost portion of the periphery of the open interior so that the liquid may drain freely from the wafer at a position between the two lowermost lugs.

It will be seen that we have provided several variations of a new and improved silicon wafer holder wherein the wafer is suspended in upright position and is held by wafer-cradling faces on opposite upright side portions of the frame which retain the edge portions of the wafer between inwardly protruding lugs. The side portions may be resiliently displaced outwardly away from the wafer so as to facilitate loading and unloading wafers. The lowermost portion of the frame is free and clear relative to the open interior wherein the wafer is confined so that the various liquids in which the wafer is treated or processed may be readily drained and rinsed from the wafer. There is no possibility of extraneous liquid or materials being captured or confined in proximity to the wafers.

Even under high temperature conditions wherein the material from which the holder is made may be slightly softened or weakened, the holder will continue to retain the wafer in its desired confined position so that the wafer may be safely handled and manipulated by moving the holder as the wafer must be carried to various locations for the necessary processing.

It will be noted that the holder of FIG. 1 has a substantial amount of space between the upper and lower ends 11 and 12 of the frame 10 and the periphery of the wafer W so that there is ample room to insert a person's fingers which are holding the wafer W for insertion of the wafer into the holder while gripping the wafer by its edges. The wafer W may be removed in this same way by gripping the edges and without engaging either face of the wafer. Of course, a suitable tool to grip the edges of the wafer may be similarly inserted in the spaces adjacent the upper and lower ends of the frame.

Similarly, the holders of FIGS. 3 and 7 have a space adjacent the top of the holder, and if desired, the lower portion of the frame 30, between the two lowermost sets of lugs 38, could be changed in shape so as to define an open and unobstructed space between the lowermost edge of the wafer W, and the lowermost portion of the frame; this change in shape would necessitate changing the lowermost portion of the frame 10 from the circular shape illustrated to a more nearly oblong shape which would tend to permit insertion of a person's fingers for gripping the edges of the wafer during loading and unloading procedures.

What is claimed is:

1. A holder for carrying and manipulating circular silicon wafers during processing of such wafers, comprising:

a stiff but flexibly yieldable molded plastic enclosure frame to embrace such a wafer and having an open interior to receive the wafer therein, the frame being uniformly stiff around the entire periphery thereof, the frame having support means whereby to provide the frame with an upright orientation, the frame having substantially upright side portions disposed opposite each other with said open interior therebetween, the frame side portions having inner wafer-cradling peripheral faces confronting said open interior and curved concavely about a horizontal axis extending through the open interior, the wafer cradling faces being predominantly unobstructed in the direction of the axis, the frame also having wafer-confining lugs on the frame side portions adjacent such faces and projecting inwardly toward said open interior for confining the edges of the wafer against movement, the lugs at each side of said faces being widely spaced from each other and said lugs being spaced from the lowermost portions of the open interior to avoid interference with the free flow of liquid from the wafers, and the frame being resiliently flexible to permit displacement of said side portions outwardly away from the open interior and wafer therein to release the lugs from the edges of the wafer.

2. The wafer holder according to claim 1 and the lugs being disposed in pairs and opposite each other to receive the wafer edge between the lugs of each of said pairs of lugs.

3. The wafer holder according to claim 1 and the frame having adjacent portions separable and divergently movable relative to each other, each of said adjacent portions being integral with a respective wafer-cradling side portion to facilitate displacement of such lugs for releasing the wafer.

4. The wafer holder according to claim 3 and including a latching means releasably retaining said separable adjacent portions of the frame together.

5. A holder for carrying and manipulating silicon wafers for processing, comprising:

a plastic frame of substantially rigid material but flexible under significant applied force, the frame having an open interior to receive such a wafer, the frame having opposite wafer-cradling side portions and lugs thereon projecting into said open interior to confine the wafer, the side portions being forcibly displaceable outwardly to release the wafer, the peripheral surface around the open interior being unobstructed in directions along and transverse to the periphery and between the lugs to permit free drainage of liquid from the wafer.

6. A holder for carrying and manipulating circular silicon wafers during processing of such wafers, comprising:

a stiff but flexibly yieldable molded plastic enclosure frame to embrace such a wafer and having an open interior to receive the wafer therein, the frame having support means whereby to provide the frame with an upright orientation, the frame having substantially upright side portions disposed opposite each other with said open interior therebetween, the frame side portions having inner wafer-cradling faces confronting said open interior and curved concavely about a horizontal axis extending through the open interior, the frame also having wafer-confining lugs on the frame side portions adjacent such faces and projecting inwardly toward said open interior for confining the edges of the wafer against movement, said lugs being spaced from the lowermost portions of the open interior to avoid interference with the free flow of liquid from the wafers, and the lugs being arranged singularly at each location on the periphery of the open interior and each lug being spaced along said periphery from the next adjacent lugs being spaced across the wafer-cradling face to confront opposite surfaces of the wafer, and the frame being flexible to permit displacement of said side portions outwardly away from the open interior and wafer therein to release the lugs from the edges of the wafer.

7. A holder for carrying and manipulating circular silicon wafers during processing of such wafers, comprising:

a stiff but flexibly yieldable molded plastic enclosure frame to embrace such a wafer and having an open interior to receive the wafer therein, the frame having support means whereby to provide the frame with an upright orientation, the frame having substantially upright side portions disposed opposite each other with said open interior therebetween, the frame side portions having inner wafer-cradling faces confronting said open interior and curved concavely about a horizontal axis extending through the open interior, the frame being endless and integral around the entire periphery of the open interior, the frame also having wafer-confining lugs on the frame side portions adjacent such faces and projecting inwardly toward said open interior for confining the edges of the wafer against movement, said lugs being spaced from the lowermost portions of the open interior to avoid interference with the free flow of liquid from the wafers, and the frame being flexible to permit displacement of said side portions outwardly away from the open interior and wafer therein to release the lugs from the edges of the wafer.

8. The wafer holder according to claim 7 and the stiff and flexibly yieldable endless frame having an inwardly displaceable portion at one peripheral location between said upright side portions whereby to produce outward displacement of said side portions and release of the lugs from the wafer as the inwardly displaceable portion is moved inwardly.

9. A holder for carrying and manipulating circular silicon wafers during processing of such wafers, comprising:

a stiff but flexibly yieldable molded plastic enclosure frame to embrace such a wafer and having an open interior to receive the wafer therein, the frame having support means whereby to provide the frame with an upright orientation, the frame having substantially upright side portions disposed opposite each other with said open interior therebetween, the frame side portions having inner wafer-cradling faces confronting said open interior and curved concavely about a horizontal axis extending through the open interior, the frame also having wafer-confining lugs on the frame side portions adjacent such faces and projecting inwardly toward said open interior for confining the edges of the wafer against movement, said lugs being spaced from the lowermost portions of the open interior to avoid interference with the free flow of liquid from the wafers, and the frame being flexible to permit displacement of said side portions outwardly away from the open interior and wafer therein to release the lugs from the edges of the wafer, the frame being integrally molded and having upper and lower ends spaced above and below said wafer-cradling faces and being inwardly displaceable toward the open interior to cause outward displacement of the side portions and faces and lugs to release the wafer.

10. The wafer holder according to claim 9 and the frame being endless and substantially oblong in shape, said support means being disposed at the top of the frame to suspend the frame in upright position.

11. A holder for carrying and manipulating circular silicon wafers during processing of such wafers, comprising:

a stiff but flexibly yieldable molded plastic integral and one piece enclosure frame to embrace such a wafer and having an open interior to receive the wafer therein, the frame having an oblong shape with an upright orientation and an apertured suspending web at the top of the enclosure frame to maintain the oblong frame in upright orientation, the frame having substantially upright side portions disposed opposite each other and in spaced relation with each other and with said open interior therebetween, the frame side portions having inner wafer-cradling faces confronting said open interior and cruved concavely about a horizontal axis extending through the open interior, the frame also having wafer-confining lugs on the frame side portions adjacent such faces and projecting inwardly toward said open interior for confining the edges of the wafer against movement in a direction transversely to the wafer, the lugs being located only along said curved wafer-cradling faces to engage only the side edges of the wafer, said upright side portions extending upwardly and downwardly well beyond said curved faces and lugs and being joined together at the top and bottom of the oblong frame to be inwardly displaceable to produce outward displacement of the wafer-cradling faces and lugs to release the wafer.

12. A holder for carrying and manipulating circular silicon wafers during processing of such wafers, comprising:

a stiff but flexibly yieldable molded plastic enclosure frame in integrally molded and one piece construction to embrace such a wafer and having an open interior to receive the wafer therein, the frame having a suspension hook at the top thereof for suspending the frame in upright position, the frame having substantially upright side portions disposed opposite each other with said open interior therebetween, the frame side portions having inner wafer-cradling faces confronting said open interior and curved circularly and concavely about a horizontal axis extending through the open interior, the frame also having a lower portion interconnecting said side portions and also being circularly curved about such an axis, the frame having lugs protruding inwardly to the open interior at said side portions and adjacent said wafer-cradling faces, the lugs being disposed at opposite sides of the wafer-cradling faces to engage both of the flat faces of the wafer and confine the wafer in the holder, the lower portion of the frame being free of obstruction in both directions and thereby allowing complete and quick drainage of liquids from the wafer, the upper ends of said frame side portions extending upwardly to said hook, and one of said upper ends being formed integrally with the adjacent hook, the other of said upper side portions being separately and divergently movable away from the hook and the other side portion for flexing the entire enclosure frame and displacing the wafer-cradling faces and lugs outwardly from the wafer for releasing the wafer, and the frame having latching means releasably holding the upper ends of the side portions in fixed relation with each other.

13. The wafer holder according to claim 12 and said lugs being elongate in a peripheral direction relative to the open interior and protruding from the frame side portions into the open interior as webs to engage and confine an elongate peripheral portion of the edge of the disc.

14. A holder for carrying and manipulating circular silicon wafers during processing of such wafers, comprising:

a stiff but flexibly yieldable molded plastic enclosure frame in integrally molded and one piece construction to embrace such a wafer and having an open interior to receive the wafer therein, the frame having a suspension hook at the top thereof for suspending the frame in upright position, the frame having substantially upright side portions disposed opposite each other with said open interior therebetween, the frame side portions having inner wafer-cradling faces confronting said open interior and curved circularly and concavely about a horizontal axis extending through the open interior, the frame also having a lower portion interconnecting said side portions and also being circularly curved about such an axis, the frame having lugs protruding inwardly to the open interior at said side portions and adjacent said wafer-cradling faces, the lugs being disposed at opposite sides of the wafer-cradling faces to engage both of the flat faces of the wafer and confine the wafer in the holder, the lower portion of the frame being free of obstruction and thereby allowing complete and quick drainage of liquids from the wafer, said lugs having the shape of pegs and being located in pairs opposite each other at various peripheral locations along said wafer-cradling faces to receive the edges of the wafer therein, and the upper ends of said frame side portions extending upwardly to said hook, and one of said upper ends being formed integrally with the adjacent hook, the other of said upper side portions being separately and divergently movable away from the hook and the other side portion for flexing the entire enclosure frame and displacing the wafer-cradling faces and lugs outwardly from the wafer for releasing the wafer, and the frame having latching means releasably holding the upper ends of the side portions in fixed relation with each other.

15. A holder for carrying and manipulating circular silicon wafers during processing of such wafers, comprising:

a stiff but flexibly yieldable molded plastic enclosure frame in integrally molded and one piece construction to embrace such a wafer and having an open interior to receive the wafer therein, the frame having a suspension hook at the top thereof for suspending the frame in upright position, the frame having substantially upright side portions disposed opposite each other with said open interior therebetween, the frame side portions having inner wafer-cradling faces confronting said open interior and curved circularly and concavely about a horizontal axis extending through the open interior, the frame also having a lower portion interconnecting said side portions and also being circularly curved about such an axis, the frame having lugs protruding inwardly to the open interior at said side portions and adjacent said wafer-cradling faces, the lugs being disposed at opposite sides of the wafer-cradling faces to engage both of the flat faces of the wafer and confine the wafer in the holder, the lower portion of the frame being free of obstruction and thereby allowing complete and quick drainage of liquids from the wafer, said lugs being elongate in a peripheral direction relative to the open interior and protruding from the frame side portions into the open interior as webs to engage and confine an elongate peripheral portion of the edge of the disc, each of said lugs being spaced from adjacent lugs in a direction around the periphery of the open interior, adjacent lugs being disposed at opposite sides of the wafer-cradling face for confronting opposite surfaces of the silicon wafer, the upper ends of said frame side portions extending upwardly to said hook, and one of said upper ends being formed integrally with the adjacent hook, the other of said upper side portions being separately and divergently movable away from the hook and the other side portion for flexing the entire enclosure frame and displacing the wafer-cradling faces and lugs outwardly from the wafer for releasing the wafer, and the frame having latching means releasably holding the upper ends of the side portions in fixed relation with each other.

* * * * *